Sept. 17, 1968 T. E. GILLIGAN 3,402,305
CROSS-COUPLED FLIP-FLOP EMPLOYING SERIES INPUT DIODE CONNECTED TO OUTPUT OF OR GATE FORMING PART OF CROSS-COUPLES
Filed Sept. 23, 1964
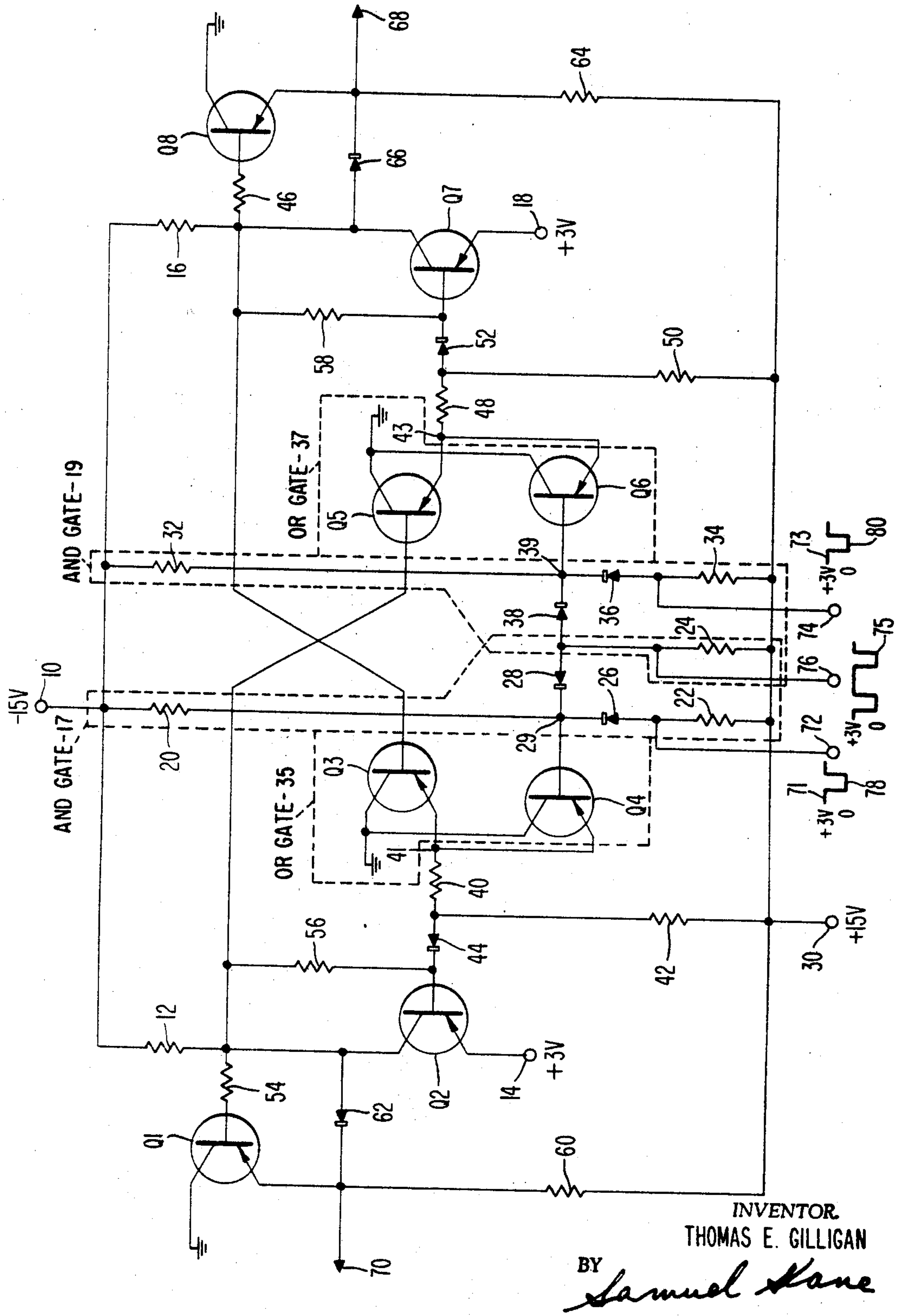
INVENTOR.
THOMAS E. GILLIGAN
BY Samuel Kane
ATTORNEY 3,402,305
CROSS-COUPLED FLIP-FLOP EMPLOYING SERIES INPUT DIODE CONNECTED TO OUTPUT OF OR GATE FORMING PART OF CROSS-COUPLES

Thomas E. Gilligan, Havertown, Pa., assignor to Burroughs Corporation, Detroit, Mich., a corporation of Michigan Filed Sept. 23, 1964, Ser. No. 398,558
8 Claims. (Cl. 307—292)

ABSTRACT OF THE DISCLOSURE

Buffering circuits receive signals from input gates for switching the flip-flop inverting stage electronic control devices from one state to the other without significantly loading down the signal source. Buffering circuits are also provided at the outputs of the inverting stage electronic control devices so that the flip-flop is prevented from being loaded down significantly by its loads. The inverting stage electronic control devices are provided with feedback impedance circuits which serve to keep them out of saturation to obtain high speed operation. Asymmetrical current conducting networks afford transient overdrive of the inverting stage electronic control devices to obtain high speed cut off. Impedance devices are also provided for suppressing oscillations in output terminals of the fiip-flop.

This invention relates generally to electronic circuit and more particularly to bistable multivibrators, also known as flip-flops. A flip-flop is know in the art as an electronic circuit which has two stable states and which requires a switching signal to induce an abrupt transition from one state to the other. While not limited thereto, flip-flop circuits find extensive application in the computer field, for example, as storage or memory devices.

An object of the invention is to provide a new and improved flip-flop of novel design.

Another object of the invention is to provide a flip-flop which can be switched at high speed from one state to the other.

A more specific object of the invention is to obtain high speed switching in a flip-flop by the provision of stable circuitry which will enable the flip-flop inverting stage control devices to be operated in the nonsaturating mode.

Another more specific object of the invention is to obtain high speed switching by the provision of suitable circuitry in a transistor flip-flop which will enable its inverting stage transistors to be overdriven to obtain fast cut-off.

A further object of the invention is the provision of input buffering means between the flip-flop switching signal source and the flip-flop inverting stage control devices to afford adequate amplification but without significantly loading down the signal source.

Another object of the invention is the provision of output buffering means to prevent the flip-flop from being loaded down significantly by its loads.

A further object of the invention is the provision of a high speed flip-flop with logic input.

Still a further object of the invention is the provision of a low cost flip-flop characterized by its use of standard components.

In accordance with the above objects, and considered first in its broader aspects, the invention comprises first and second electronic control devices each having a collector electrode and a control electrode, and first and second electronic gates each having an output terminal and first and second input terminals. Means are provided for coupling the collector electrode of the first electronic control device to the first input terminal of the first electronic gate and for coupling the collector electrode of the second electronic control device to the first input terminal of the second electronic gate. An impedance means and an asymmetrical current conducting means connect the control electrode of the first electronic control device to the output terminal of the second electronic gate, and an impedance means and an asymetrical current conducting means connect the control electrode of the second electronic control device to the output terminal of the first electronic gate. Means are also provided for applying a signal to either one of the second input terminals for actuating the associated electronic gate.

The invention will be more clearly understood when the following detailed description of the preferred embodiment thereof is read in conjunction with the accompanying drawing in which the figure is a schematic diagram of the flip-flop circuit constructed in accordance with the invention.

Turning now to the detailed description, and with reference to the drawing, the invention utilizes a plurality of electronic control devices which are illustrated in this embodiment in one form as PNP transistor Q1–Q8.

The flip-flop inverting stage transistors as the transistors Q2 and Q7. Transistor Q2 has its collector electrode coupled to a source of negative potential 10 through a resistor 12 and its emitter electrode coupled to a source of positive potential 14. The transistor Q7 similarly has its collector electrode coupled to the source of negative potential 10 through a resistor 16 and its emitter electrode coupled to a source of positive potential 18.

When the flip-flop is in one of its states, one of the inverting stage transistors Q2 or Q7 will be ON and conducting, and the other of these two transistors will be OFF and nonconducting. When the flip-flop is in the other state, the reverse situation will obtain, as is understood.

Input switching signals are introduced into the flip-flop for turning ON the respective inverting stage transistors Q2 and Q7 by means of AND gates 17 and 19. Thus the AND gate 17 for introducing a signal for turning ON the transistor Q2 includes resistors 20, 22 and 24, and diodes 26 and 28. The negative electrodes of the diodes 26 and 28 are connected to the AND gate 17 output terminal 29 and to the base electrode of transistor Q4, and to one end of resistor 20 the other end of which is returned to the source of negative potential 10. Resistors 22 and 24 are connected at one end to the positive electrodes of diodes 26 and 28 respectively, and at their other ends to a source of positive potential 30. The AND gate 19 for introducing a switching signal for turning ON the transistor Q7 includes resistors 32 and 34, diodes 36 and 38, and the resistor 24 which is common to both of the AND gates 17 and 19. The negative electrodes of the diodes 36 and 38 are connected to the output terminal 39 of this particular gate 19 and to the base electrode of transistor Q6, and to one end of resistor 32 the other end of which is returned to the source of negative potential 10. The resistors 24 and 34 are conected at one of their ends to the positive electrodes of the diodes 38 and 36 respectively, and are connected at their other ends to the source of positive potential 30.

Input buffering means are provided between the AND gates 17 and 19 and the inverting stage transistors Q2 and Q7. In the present embodiment the input buffers take the form of transistor emitter-follower circuits connected in the form of transistor OR gates 35 and 37. Thus the input buffer transistor OR gate 35 for the inverting stage transistor Q2 includes the transistors Q3 and Q4 which have their emitter electrodes connected in an OR node 41, which is the output terminal of this particular OR gate 35, and their collector electrodes coupled together and returned to ground. Common to the emitter circuits of the transistors Q3 and Q4 are resistors 40 and 42 which are connected together at one end, and with the other end of resistor 40 connected to the junction 41 of the emitters of these transistors. The other end of resistor 42 is coupled to the source of positive potential 30. The positive electrode of a diode 44 is connected to the junction of the resistors 40 and 42, and its negative electrode is connected to the base electrode of the transistor Q2. The base electrode of transistor Q3 is one of the input terminals to this particular OR gate 35 and is coupled to the collector of transistor Q7 and to the base electrode of transistor Q8 through a resistor 46. The other input terminal to this OR gate 35 is terminal 29.

The input buffer transistor OR gate 37 for the transistor Q7 includes the transistors Q5 and Q6 which have their emitter electrodes connected in an OR node 43, which is the output terminal of this particular OR gate 37, and their collector electrodes coupled together and returned to ground. Common to the emitter circuits of these transistors Q5 and Q6 are resistors 48 and 50, which are connected together at one end, and with the other end of resistor 48 connected to the emitters of these transistors. The other end of resistor 50 is returned to the source of positive potential 30. The positive electrode of a diode 52 is connected to the junction of resistors 48 and 50, and its negative electrode is connected to the base electrode of the transistor Q7. The base electrode of transistor Q5 is one of the input terminals to this particular OR gate 37 and is coupled to the collector of transistor Q2 and to the base electrode of transistor Q1 through a resistor 54. The other input terminal to this OR gate 37 is terminal 39.

A feedback resistor 56 is connected at one end to the collector electrode of transistor Q2 and at its other end to the base electrode of this transistor. A feedback resistor 58 is similarly connected to the collector and base electrodes of the transistor Q7.

The output buffering means for both outputs of the flip-flop are illustrated in the form of emitter-follower circuits. Thus the output buffer at the output of the transistor Q2 includes the transistor Q1 and a resistor 60 which is connected at one end to the emitter of transistor Q1 and is returned at its other end to the source of positive potential 30. A diode 62 has its positive electrode connected to the collector electrode of the transistor Q2 and its negative electrode connected to the emitter electrode of transistor Q1. Similarly, the output buffer at the output of the transistor Q7 includes the transistor Q8 and a resistor 64 which is coupled at one end to the emitter of transistor Q8 and at its other end to the source of positive potential 30. A diode 66 has its positive electrode connected to the collector electrode of the transistor Q7 and its negative electrode connected to the emitter electrode of transistor Q8.

In describing the operation of the flip-flop it will be assumed that it is in one of its states and the operation will be described for switching it to the other state. Accordingly, it will be assumed that the transistor Q7 is in the ON condition and conducting in which case its collector voltage will be at a high level so that the voltage of the output terminal 68 will also be high and will be taken to represent a binary "0." Also, the transistor Q2 will accordingly be in the OFF condition and nonconducting so that its collector voltage will be at a low level and therefore the voltage of the output at terminal 70 will also be low and will be taken to represent a binary "1." Transistors Q1, Q3, Q4, Q5 and Q8 will also be ON and conducting, and transistor Q6 will be OFF and nonconducting. Diodes 62, 66 and 52 will be reverse biased, and diode 44 will be forward biased.

In this state of the flip-flop, current will flow in a circuit which includes the source of positive potential 18, transistor Q7, the resistor 16, and the source of negative potential 10. Current will also flow in a parallel circuit which includes the source of positive potential 18, transistor Q7, the feedback resistor 58, resistor 16, and the source of negative potential 10. Current will also flow in a voltage dividing network which includes the source of positive potential 30, resistor 42, diode 44, resistor 56, resistor 12, and the source of negative potential 10.

In the steady state condition, the junction between resistor 22 and diode 26 is placed at a positive voltage level 71 of approximately three volts through a terminal 72, and the junction between resistor 34 and diode 36 is similarly placed at a positive voltage level 73 of approximately three volts through a terminal 74. A series of clock pulses 75 is applied to the junction between resistor 24 and diodes 28 and 38 through a terminal 76. The clock pulses swing from a positive level of approximately three volts to a voltage level of approximately zero volts.

In order to switch the flip-flop to its other state, a negative pulse 78 of three volts is applied to the terminal 72 to lower the voltage level to approximately zero volts. This is done in point of time so that the zero voltage level at the terminal 72 will coincide with the zero voltage level of one of the clock pulses at the terminal 76. The zero voltage at terminal 72 is held at such level for a time sufficient to enable the flip-flop to make its transition.

The output voltage level of the AND gate 17 at the base of transistor Q4 will therefore fall so that the potentials of the emitters of transistors Q3 and Q4, as well as the potential of the junction between resistor 40 and diode 44, will fall likewise. This will cause the diode 44 to be reverse biased and will turn ON transistor Q2. Base current will now be supplied to transistor Q2 through the feedback resistor 56 which also serves to keep transistor Q2 out of saturation. As the collector voltage of transistor Q2 rises to its high level, the output voltage at terminal 70 will rise rapidly because of the forward biasing of diode 62 by the rising collector voltage of this transistor. The resistor 54 serves to dampen or suppress oscillations in the output at terminal 70.

As the collector voltage of transistor Q2 rises to its upper level, the base voltage of transistor Q5 will also rise so that the potentials of the emitters of transistors Q5 and Q6, and the potential of the junction between resistor 48 and diode 52 will also rise a corresponding amount. This will forward bias the emitter-base junction of transistor Q6, thus turning it ON, and will also forward bias and turn ON diode 52.

When diode 52 turns ON, current will flow in the steady state in a circut which will include the source of positive potential 30, resistor 50, the diode 52, the feedback resistor 58, the resistor 16, and the source of negative potential 10. However, from the instant that diode 52 turns ON, and until the potential of the collector electrode of transistor Q7 reaches its lower level due to its turning OFF, transient current will flow from the base of transistor Q7 through a circuit which will include the source of positive potential 18, the emitter and base electrodes of transistor Q7, diode 52, resistor 50, and the source of positive potential 30. This transient overdrive of the base electrode of transistor Q7 provides for very fast cut off of this transistor.

When transistor Q7 is cut OFF, its collector potential will be at a low level so that the output voltage at terminal 68 will also be at a low level and may be regarded as a binary "1." As the collector potential of transistor Q7 falls to its low level, the potential of the base electrode of transistor Q3 will do likewise. The transition is now substantially complete, so that the switching signal at terminal 72 may now be removed and the potential at this terminal thus restored to its upper level of three volts. Restoring the potential of terminal 72 to its upper level will cause the base electrode of transistor Q4 to rise accordingly. The emitter-base junction of transistor Q4 will now be reverse biased so that transistor Q4 will be in the OFF condition.

The flip-flop has now been switched from the assumed state to the other state. In order to switch it back again, a negative pulse 80 of three volts is applied in a similar manner to terminal 74.

A model of the illustrated flip-flop was constructed and tested. The components had the following values and identity:

| | | |
|---|---|---|
| Resistors **22, 24, 34, 60** and **64** | ohms | 3000 |
| Resistors **20** and **32** | do | 6800 |
| Resistors **46** and **54** | do | 100 |
| Resistors **12** and **16** | do | 910 |
| Resistors **56** and **58** | do | 270 |
| Resistors **42** and **50** | do | 680 |
| Resistors **40** and **48** | do | 100 |
| Transistor | | type 2N964 |
| Diodes **44** and **52** | | Clevite CGD–1092 |
| All other diodes | | DS–100029–3 (type T6) |

While there has been shown and described a particular circuit to exemplify the principles of the invention, it is to be understood that this is but one embodiment thereof and that the invention is capable of being constructed in a variety of shapes, sizes and modifications without departing from the true spirit and scope thereof. Accordingly, it is to be understood that the invention is not to be limited by the specific circuit described, but only by the subjoined claims.

I claim:

1. A bistable circuit comprising, first and second transistors each having a collector electrode and a base electrode, first and second electronic gates each having an output terminal and first and second input terminals, means coupling the collector electrode of said first transistor to the first input terminal of said first electronic gate, means coupling the collector electrode of said second transistor to the first input terminal of said second electronic gate, asymmetrical current conducting means connected between the base electrode of said first transistor and the output terminal of said second electronic gate and biased in operation so that base current of said first transistor will not flow through it, asymmetrical current conducting means connected between the base electrode of said second transistor and the output terminal of said first electronic gate and biased in operation so that base current of said second transistor will not flow through it, and means for applying a signal to either one of said second input terminals for actuating the associated electronic gate.

2. A multivibrator comprising, first and second transistors each having a collector electrode and a base electrode, first and second electronic OR gates each having an output terminal and first and second input terminals, means coupling the collector electrode of said first transistor to the first input terminal of said first electronic OR gate, means coupling the collector electrode of said second transistor to the first input terminal of said second electronic OR gate, asymmetrical current conducting means connected between the base electrode of said first transistor and the output terminal of said second electronic OR gate and biased in operation so that base current of said first transistor will not flow through it, asymmetrical current conducting means connected between the base electrode of said second transistor and the output terminal of said first elevtronic OR gate and biased in operation so that base current of said second transistor will not flow through it, and means for applying a signal to either one of said second input terminals for actuating the associated electronic OR gate.

3. A bistable circuit comprising, first and second electronic control devices each having a collector electrode and a control electrode, feedback impedance means connecting the collector and control electrodes of said first electronic control device, feedback impedance means connecting the collector and control electrodes of said second electronic control device, first and second electronic gates each having an output terminal and first and second input terminals, means coupling the collector electrode of said first electronic control device to the first input terminal of said first electronic gate, means coupling the collector electrode of said second electronic control device to the first input terminal of said second electronic gate, asymmetrical current conducting means connected to the control electrode of said first electronic control device and to the output terminal of said second electronic gate, asymmetrical current conducting means connected to the control electrode of said second electronic control device and to the output terminal of said first electronic gate, and means for applying a signal to either one of said second input terminals for actuating the associated electronic gate.

4. A bistable multivibrator comprising, first and second electronic control devices each having a collector electrode and a control electrode, feedback impedance means connecting the collector and control electrodes of said first electronic control device, feedback impedance means connecting the collector and control electrodes of said second electronic control device, first and second electronic OR gates each having an output terminal and first and second input terminals, means coupling the collector electrode of said first electronic control device to the first input terminal of said first electronic OR gate, means coupling the collector electrode of said second electronic control device to the first input terminal of said second electronic OR gate, an impedance means and an asymmetrical current conducting means connecting the control electrode of said first electronic control device to the output terminal of said second electronic OR gate, an impedance means and an asymmetrical current conducting means connecting the control electrode of said second electronic control device to the output terminal of said first electronic OR gate, and means for applying a signal to either one of said second input terminals for actuating the associated electronic OR gate.

5. A bistable multivibrator comprising, first and second electronic control devices each having a collector electrode and a control electrode, first and second electronic gates each having an output terminal and first and second input terminals, means coupling the collector electrode of said first electronic control device to the first input terminal of said first electronic gate, means coupling the collector electrode of said second electronic control device to the first input terminal of said second electronic gate, an impedance means and an asymmetrical current conducting means connecting the control electrode of said first electronic control device to the output terminal of said second electronic gate, an impedance means and an asymmetrical current conducting means connecting the control electrode of said second electronic control device to the output terminal of said first electronic gate, a third electronic control device and a fourth electronic control device each having an emitter electrode and a control electrode, an asymmetrical current conducting means connecting the collector electrode of said first electronic control device to the emitter electrode of said third electronic control device, an asymmetrical current conducting means connecting the collector electrode of said second electronic control device to the emitter electrode of said fourth electronic control device, impedance means coupling the control electrode of said third electronic control device to the collector electrode of said first electronic control device, impedance means coupling the control electrode of said fourth electronic control device to the collector electrode of said second electronic control device, and means for applying a signal to either one of said second input terminals for actuating the associated electronic gate.

6. A flip-flop circuit comprising, first and second electronic control devices each having a collector electrode and a control electrode, impedance means connecting the collector and control electrodes of said first electronic control device, impedance means connecting the collector and control electrodes of said second electronic control device, first and second electronic gates each having an output terminal and first and second input terminals, means coupling the collector electrode of said first electronic control device to the first input terminal of said first electronic gate, means coupling the collector electrode of said second electronic control device to the first input terminal of said second electronic gate, an impedance means and an asymmetrical current conducting means connecting the control electrode of said first electronic control device to the output terminal of said second electronic gate, an impedance means and an asymmetrical current conducting means connecting the control electrode of said second electronic control device to the output terminal of said first electronic gate, a third electronic control device and a fourth electronic control device each having an emitter electrode and a control electrode, an asymmetrical current conducting means connecting the collector electrode of said first electronic control device to the emitter electrode of said third electronic control device, an asymmetrical current conducting means connecting the collector electrode of said second electronic control device to the emitter electrode of said fourth electronic control device, impedance means coupling the control electrode of said third electronic control device to the collector electrode of said first electronic control device, impedance means coupling the control electrode of said fourth electronic control device to the collector electrode of said second electronic control device, and means for applying a signal to either one of said second input terminals for actuating the associated electronic gate.

7. A flip-flop circuit comprising, first and second transistors each having a collector electrode and a base electrode, impedance means connecting the collector and base electrodes of said first transistor, impedance means connecting the collector and base electrodes of said second transistor, first and second electronic gates each having an output terminal and first and second input terminals, means coupling the collector electrode of said first transistor to the first input terminal of said first electronic gate, means coupling the collector electrode of said second transistor to the first input terminal of said second electronic gate, an impedance means and an asymmetrical current conducting means connecting the base electrode of said first transistor to the output terminal of said second electronic gate, an impedance means and an asymmetrical current conducting means connecting the base electrode of said second transistor to the output terminal of said first electronic gate, a third transistor and a fourth transistor each having an emitter electrode and a base electrode, an asymmetrical current conducting means connecting the collector electrode of said first transistor to the emitter electrode of said third transistor, an asymmetrical current conducting means connecting the collector electrode of said second transistor to the emitter electrode of said fourth transistor, impedance means coupling the base electrode of said third transistor to the collector electrode of said first transistor, impedance means coupling the base electrode of said fourth transistor to the collector electrode of said second transistor, and means for applying a signal to either one of said second input terminals for actuating the associated electronic gate.

8. A flip-flop circuit comprising, first and second transistors each having a collector electrode and a base electrode, impedance means connecting the collector and base electrodes of said first transistor, impedance means connecting the collector and base electrodes of said second transistor, first and second transistor OR gates each having an output terminal and first and second input terminals, means coupling the collector electrode of said first transistor to the first input terminal of said first transistor OR gate, means coupling the collector electrode of said second transistor to the first input terminal of said second transistor OR gate, an impedance means and an asymmetrical current conducting means connecting the base electrode of said first transistor to the output terminal of said second transistor OR gate, an impedance means and an asymmetrical current conducting means connecting the base electrode of said second transistor to the output terminal of said first transistor OR gate, a third transistor and a fourth transistor each having an emitter electrode and a base electrode, an asymmetrical current conducting means connecting the collector electrode of said first transistor to the emitter electrode of said third transistor, an asymmetrical current conducting means connecting the collector electrode of said second transistor to the emitter electrode of said fourth transistor, impedance means coupling the base electrode of said third transistor to the collector electrode of said first transistor, impedance means coupling the base electrode of said fourth transistor to the collector electrode of said second transistor, and two diode AND gates each for applying a signal to one of said second input terminals for actuating the associated transistor OR gate.

References Cited

UNITED STATES PATENTS

| | | | |
|---|---|---|---|
| 2,939,969 | 6/1960 | Kwap et al. | 307—88.5 |
| 3,045,128 | 7/1962 | Skerritt | 307—88.5 |
| 3,067,336 | 12/1962 | Eachus | 307—88.5 |
| 3,134,030 | 5/1964 | Dao | 307—88.5 |
| 3,294,980 | 12/1966 | Whittle | 307—88.5 |

JOHN S. HEYMAN, *Primary Examiner.*